US009985061B2

(12) United States Patent
Miyamoto et al.

(10) Patent No.: US 9,985,061 B2
(45) Date of Patent: May 29, 2018

(54) LIGHT DETECTION DEVICE WITH INTEGRATED PHOTODIODE AND THIN FILM TRANSISTOR

(71) Applicant: Sharp Kabushiki Kaisha, Osaka (JP)

(72) Inventors: Tadayoshi Miyamoto, Osaka (JP); Kazuhide Tomiyasu, Osaka (JP); Atsushi Tomyo, Osaka (JP); Kazuatsu Ito, Osaka (JP); Shigeyasu Mori, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days. days.

(21) Appl. No.: 15/126,821

(22) PCT Filed: Mar. 19, 2015

(86) PCT No.: PCT/JP2015/058246
§ 371 (c)(1),
(2) Date: Sep. 16, 2016

(87) PCT Pub. No.: WO2015/141777
PCT Pub. Date: Sep. 24, 2015

(65) Prior Publication Data

US 2017/0092673 A1 Mar. 30, 2017

(30) Foreign Application Priority Data

Mar. 20, 2014 (JP) ................................ 2014-058091

(51) Int. Cl.

| | |
|---|---|
| ***H01L 27/146*** | (2006.01) |
| *H01L 29/786* | (2006.01) |
| *H01L 29/24* | (2006.01) |

(52) U.S. Cl.
CPC .. *H01L 27/14614* (2013.01); *H01L 27/14616* (2013.01); *H01L 27/14663* (2013.01);
(Continued)

(58) Field of Classification Search
CPC ......... H01L 27/14614; H01L 27/14616; H01L 27/14663
See application file for complete search history.

(56) References Cited

U.S. PATENT DOCUMENTS

2001/0019130 A1* 9/2001 Yamazaki ........... G02F 1/13318 257/72
2001/0022363 A1 9/2001 Nagata et al.
(Continued)

FOREIGN PATENT DOCUMENTS

JP 2001-250932 A 9/2001
JP 2004-265935 A 9/2004
(Continued)

*Primary Examiner* — Benjamin Sandvik
*Assistant Examiner* — Farid Khan
(74) *Attorney, Agent, or Firm* — Chen Yoshimura LLP

(57) ABSTRACT

A light detection device includes: a TFT having a semiconductor layer supported on a substrate, a source electrode, a drain electrode, and a gate electrode; a photodiode having a bottom electrode electrically connected to the drain electrode, a semiconductor laminate structure, and a top electrode; and an electrode made of the same conductive film as the bottom electrode and arranged on the semiconductor layer with an insulating layer interposed therebetween.

13 Claims, 8 Drawing Sheets

(52) U.S. Cl.
CPC .......... *H01L 29/24* (2013.01); *H01L 29/7869* (2013.01); *H01L 29/78648* (2013.01); *H01L 29/78696* (2013.01)

(56) References Cited

U.S. PATENT DOCUMENTS

2006/0071251 A1* 4/2006 Watanabe ............... H01L 27/12 257/291
2006/0227232 A1* 10/2006 Zhang ............... H01L 27/14634 348/294
2006/0258080 A1* 11/2006 Takahashi ........... H01L 27/1214 438/231
2009/0302202 A1 12/2009 Sato et al.
2012/0001170 A1* 1/2012 Yamazaki ........... H01L 27/1225 257/43
2012/0074474 A1* 3/2012 Kitagawa .......... H01L 27/14612 257/291
2012/0261656 A1* 10/2012 Shu .......................... G01J 1/42 257/43
2012/0319114 A1 12/2012 Yamazaki et al.
2012/0319183 A1* 12/2012 Yamazaki ........... H01L 29/7782 257/288
2013/0100330 A1* 4/2013 Yamada ................... H04N 5/32 348/333.01
2013/0206993 A1* 8/2013 Ibuki ..................... G01T 1/2006 250/366
2013/0292573 A1* 11/2013 Antonuk ............. H01L 27/1462 250/361 R
2014/0103347 A1* 4/2014 Ishino ............... H01L 27/14692 257/59

FOREIGN PATENT DOCUMENTS

JP 2009-302092 A 12/2009
JP 2013-21312 A 1/2013
JP 2013-21315 A 1/2013
JP 2013-90274 A 5/2013
JP 2013-156119 A 8/2013
WO 2010/150431 A1 12/2010

* cited by examiner (a)

(b)

Source/Gate Contact Section
TFT/Photodiode Section
Bottom Electrode/Gate Contact Section
(a)
11
18
18L
(b)
13
11
12
18
18L
(c)
13a
13
11
12
18
18L
(d)
14L
13
11
14
12
18
16
18L
(e)
61a
61b
61
14L
13
11
14
12
18
16
18L
(f)
61
14L
13
11
14
12
18
50
16
22
22L
18L Source/Gate Contact Section
TFT/Photodiode Section
Bottom Electrode/Gate Contact Section
(a)
(b)
(c)
(d)
26
28
61
62
64
14L
13
11
22L
18L
14
12
18
50
16
22
24n
24i
24p
24
100

(a)
110
28
26
50
64
62
61
13
11
14
12
18
16
22
24n
24i
24p
24
10
20
(b)
14
28
50
16
110
18
4A
4A'
10
22
26
20

(a)
120
28
26
50
64
62
61
13
11
14
12
18
16
22
24n
24i
24p
24
10
20
(b)
14
28
50
16
120
18
5A
5A'
10
22
26
20

(a)
130
28
26
50
64
62
61
13
11
24n 24i 24p
24
14 12 18 16 22
10
20
(b)
14 50
28
16
130
18
6A
6A'
10
22
26
20

(a)

(b)

LIGHT DETECTION DEVICE WITH INTEGRATED PHOTODIODE AND THIN FILM TRANSISTOR

TECHNICAL FIELD

The present invention relates to a light detection device that includes photodiodes and thin film transistors.

BACKGROUND ART

Flat-panel detection devices, which have photodiodes for converting light to electric charge and thin film transistors (TFTs) that function as switching devices arranged in a matrix, are widely used as image sensors, photosensors, and the like. Flat-panel detection devices, when further equipped with a wavelength conversion layer such as a scintillator that converts radiation into light, are widely used as radiation detection devices (such as adhesive image sensors or X-ray detection devices) in the field of medicine, for example. Flat-panel radiation detection devices (FPD: flat panel detectors) detect radiation through an indirect conversion scheme in which the scintillator (such as a Csl scintillator) converts the radiation (X-rays, for example) into light and then the photodiodes convert the light into electric charge. Alternatively, instead of an indirect conversion scheme, it is possible to detect radiation using a direct conversion scheme in which radiation information is converted into direct electrical signals by a photoelectric conversion layer (such as an Se layer). In general, indirect conversion schemes have a higher S/N ratio (signal-to-noise ratio) than direction conversion schemes, which makes it possible to detection radiation with a small amount of exposure.

Patent Document 1 discloses a radiation imaging device that includes photodiodes, TFTs, and a wavelength conversion layer.

RELATED ART DOCUMENTS

Patent Documents

Patent Document 1: Japanese Patent Application Laid-Open Publication No. 2013-156119

SUMMARY OF THE INVENTION

Problems to be Solved by the Invention

According to research performed by the inventors of the present invention, however, the radiation imaging device described in Patent Document 1 is not sufficiently reliable.

The present invention was made to solve the above-mentioned problem and aims at improving the reliability of a light detection device that has photodiodes and TFTs.

Means for Solving the Problems

A light detection device according to an embodiment of the present invention includes: a substrate; a thin film transistor on the substrate, the thin film transistor including a semiconductor layer, a source electrode, a drain electrode, and a gate electrode; an insulating layer that covers the semiconductor layer; a photodiode formed on the insulating layer, the photodiode including a bottom electrode directly connected to the drain electrode of the thin film transistor through a contact hole formed in the insulating layer, a semiconductor laminate structure, and a top electrode that sandwiches the semiconductor laminate structure with the bottom electrode; and an electrode formed on the insulating layer, the electrode being made of a same conductive film as the bottom electrode of the photodiode and arranged so as to overlap the semiconductor layer with the insulating layer interposed therebetween, the electrode being either one of the gate electrode or a separate electrode different from the gate electrode.

In one embodiment, the gate electrode is arranged between the substrate and the semiconductor layer of the thin film transistor, and the electrode includes a portion facing the gate electrode across the semiconductor layer of the thin film transistor.

In one embodiment, the electrode is the separate electrode different from the gate electrode and is electrically connected to the gate electrode.

In one embodiment, the electrode is the separate electrode different from the gate electrode and is electrically connected to the source electrode.

In one embodiment, the electrode is the separate electrode different from the gate electrode and is in an electrically floating state.

In one embodiment, the electrode is the separate electrode different from the gate electrode and is connected to a wiring line that is electrically isolated from both the source electrode and the gate electrode.

In one embodiment, the electrode is the gate electrode.

In one embodiment, an additional electrode between the substrate and the semiconductor layer is further included, the additional electrode being connected to a wiring line that is electrically isolated from both the source electrode and the gate electrode In one embodiment, the semiconductor layer of the thin film transistor includes an oxide semiconductor.

In one embodiment, the oxide semiconductor includes an In—Ga—Zn—O semiconductor.

In one embodiment, the In—Ga—Zn—O semiconductor includes crystalline sections.

Effects of the Invention

Embodiments of the present invention improve the reliability of a light detection device having photodiodes and TFTs.

DETAILED DESCRIPTION OF EMBODIMENTS

First, the reasons, as found by the inventors of the present invention, that the reliability of the radiation imaging device in Patent Document 1 is insufficient will be explained.

The radiation imaging device of Patent Document 1 is made by forming the TFTs and then forming the photodiodes. As an example, one of the reasons the reliability of the radiation imaging device of Patent Document 1 is insufficient is it was found that, in the process of forming the photodiodes, the semiconductor layer of the TFTs is damaged (such as due to etching), which changes the properties of the TFTs. A change in the properties of the TFTs means, for example, an increase in OFF current (leakage current), a shifting of the threshold voltage, or the like. Such issues concerning insufficient reliability often tend to occur in radiation imaging devices in which dry etching is used during the photodiode forming process and/or an oxide semiconductor is used as the semiconductor layer (active layer) of the TFTs. Oxide semiconductors include In—Ga—Zn—O semiconductors that have indium, gallium, zinc, and oxygen as the primary components thereof, for example.

Figure 1:
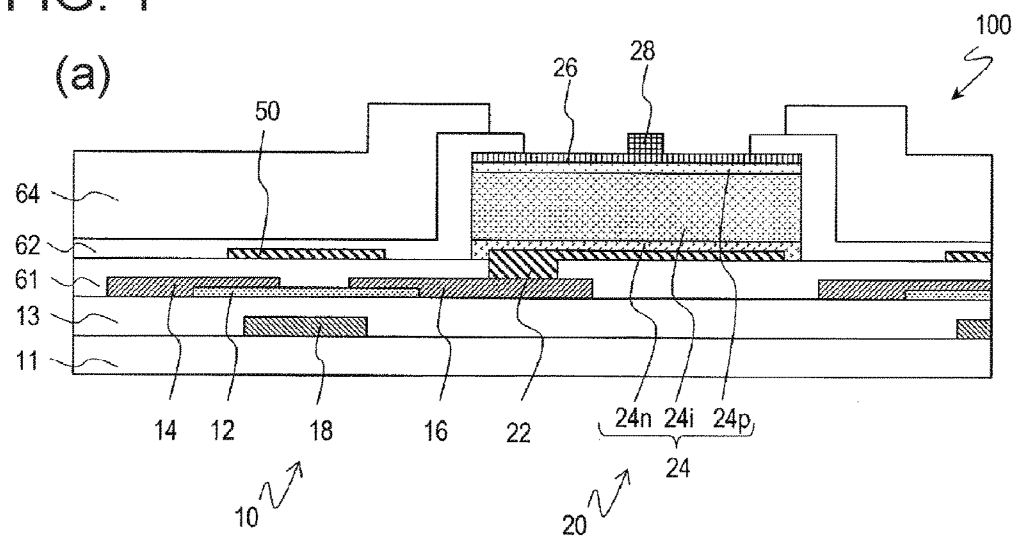
FIG. 1(*a*) is a light detection device 100 of one embodiment of the present invention in a schematic cross-section along line 1A-1A' in FIG. 1(*b*), which itself is a schematic plan view of the light detection device 100.
Figure 1:
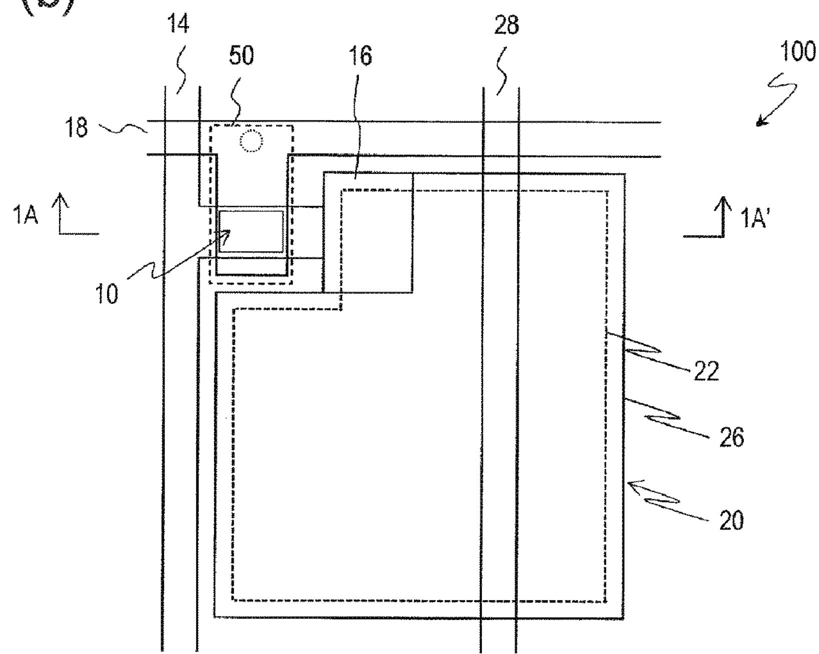

In general, the thickness of the semiconductor laminate structure is greater than the thickness of the semiconductor layer of the TFT; thus, in the process of forming the semiconductor laminate structure of the photodiode, etching can take a long time. Furthermore, in the etching process, due to unevenness (variation) in the thickness of the layer and/or deposition film to be etched, there are times when the layer below the layer to be etched is etched (overetching), for example. In the radiation imaging device of Patent Document 1, as shown by FIG. 1 of Patent Document 1, the semiconductor layer of the TFT is covered by an insulating layer that is formed from a film below the bottom electrode of the photodiode. In the etching process for forming the semiconductor laminate structure of the photodiode, the semiconductor layer of the TFT in the radiation imaging device of Patent Document 1 can be damaged (processing damage) by the insulating film being etched and/or charge accumulating on the insulating film (charge-up). Damaging of the semiconductor layer can cause the radiation imaging device of Patent Document 1 to have initial variations in the properties of the TFTs therein. The changing of the TFT properties and/or variation in the properties of the TFTs caused the issue of insufficient reliability in the radiation imaging device of Patent Document 1.

Generally, dry etching tends to cause more processing damage than wet etching. Moreover, TFTs that have an oxide semiconductor as semiconductor layer material tend to have larger changes in properties than TFTs using silicon-based semiconductors due to being heat-treated and/or changes in the concentration of oxygen in the film contacting the semiconductor layer.

It should be noted that these explanations are observations by the inventors of the present invention and do not limit the present invention.

A light detection device according to embodiments of the present invention will be described below with reference to the drawings. The light detection device according to one embodiment is a flat-panel photosensor, image sensor, or radiation detection device (X-ray imaging display device), for example. The present invention, however, is not limited to the embodiments below. In the drawings described below, constituting components having practically the same functions are shown with common reference characters, and descriptions thereof may be omitted.

FIG. 1 shows a schematic cross-sectional and plan view of a light detection device 100 according to an embodiment of the present invention. FIG. 1(*a*) is a schematic cross-sectional view of the light detection device 100 along the line 1A-1A' in FIG. 1(*b*), and FIG. 1(*b*) is a schematic plan view of the light detection device 100.

As shown in FIG. 1(*a*), the light detection device 100 includes a TFT 10, photodiode 20, and electrode 50. The TFT 10 includes a semiconductor layer 12 supported by a substrate 11, a source electrode 14 and drain electrode 16, and a gate electrode 18. The TFT 10 of the light detection device 10 is a bottom gate-type TFT. The photodiode 20 includes a bottom electrode 22 electrically connected to the drain electrode 16, a semiconductor laminate structure 24, and a top electrode 26. The electrode 50 is formed of the same semiconductor film as the bottom electrode 22 and is arranged so as to overlap the semiconductor layer 12 with an insulating layer (first passivation film 61, for example) therebetween.

The light detection device 100 includes the electrode 50 formed of the same conductive film as the bottom electrode 22, and when viewed from a direction normal to the substrate 11, the electrode 50 overlaps the semiconductor layer 12 with the insulating layer (first passivation film 61) interposed therebetween; therefore, during the process (etching process, for example) of forming the semiconductor laminate structure 24, the electrode 50 can function as an etch-stop for the insulating layer (first passivation film 61). Furthermore, during the process of forming the semiconductor laminate structure 24 (dry etching process, for example), the electrode 50 can suppress charge from accumulating on the insulating layer (first passivation film 61). Due to the above reasons, damage to the semiconductor layer 12 can be reduced during the process of forming the semiconductor laminate structure 24. The light detection device 100 suppresses changes in the properties of the TFT 10 and reduces variation in the properties of the TFT 10, thus exhibiting excellent reliability. It is preferable that the electrode 50, when seen from the direction normal to the substrate 11, overlap at least a portion of the semiconductor layer 12 serving as the channel region. It is preferable that the electrode 50, when seen from the direction normal to the substrate 11, overlap the entirety of the semiconductor layer 12.

The electrode 50 is made from the same conductive film as the bottom electrode 22, and thus the light detection device 100 does not require additional manufacturing steps and has excellent reliability.

The TFT 10 further includes a gate insulating film 13 between the gate electrode 18 and the semiconductor layer 12. The TFT 10 may further include an insulating film (not shown) so as to contact at least a portion of the top of the semiconductor layer 12 serving as the channel region. This insulating film can function as an etch-stop during the formation of the source electrode 14 and the drain electrode 16. The photodiode 20 further includes a bias electrode 28 on the top electrode 26, for example. The light detection device 100 further includes a second passivation film 62 and a planarizing film 64 on the electrode 50 and photodiode 20, for example.

As shown in FIG. 1(*b*), the TFT 10 is connected to the corresponding gate bus line 18 and corresponding source bus line 14, and the top electrode 26 of the photodiode 20 is connected to a corresponding bias line 28. For simplicity, the gate bus line 18, source bus line 14, and bias line 28 are shown with the same respective reference characters as the gate electrode 18, source electrode 14, and bias electrode 28.

The light detection device 100 includes the TFTs 10 and photodiodes 20 arrayed in a matrix, for example, and each photodiode 20 is connected to one of the TFTs 10. Each of the plurality of the pixels of the light detection device 100 is constituted by a photodiode 20. The photodiode 20 converts light that is incident on the semiconductor laminate structure 24 into charge (electrons or holes). When a voltage is applied between the bias electrode 28 and the drain electrode 16 in order to reverse-bias the semiconductor laminate structure 24, the light that is incident on the semiconductor laminate structure 24 is converted to charge excited within the depletion layer. The charge generated by the photodiode 20 is extracted to outside via the source bus line 14 by the TFT 10 connected to the photodiode 20 being turned ON by a signal supplied to the gate bus line 18. In this manner, the light detection device 100 converts the light that is incident on the semiconductor laminate structure 24 into current and outputs electrical signals or images.

The light detection device 100 may further include a wavelength conversion layer (not shown) above the photodiode 20. The wavelength conversion layer includes a scintillator (a Csl scintillator, for example). The light detection device, by further including the wavelength conversion layer, can function as a radiation detection device, for example.

The light detection device 100 may further include an insulating planarizing film (not shown) between the first passivation film 61 and the bottom electrode 22 and electrode 50. By having this planarizing film, the light detection device 100 can reduce noise in the charge signals (image signals) and increase the S/N ratio. Furthermore, the planarizing film makes it possible to reduce parasitic capacitance and/or suppress leakage current among the wiring lines.

As shown in FIG. 1(*a*), the electrode 50 has a portion facing the gate electrode 18 through the semiconductor layer 12, for example. The electrode 50 is electrically connected to the gate electrode 18, for example. A method of electrically connecting the electrode 50 to the gate electrode 18 will be described later with reference to FIGS. 2 and 3. The light detection device 100 has the electrode 50 electrically connected to the gate electrode 18; therefore, in the process (dry etching process, for example) of forming the semiconductor laminate structure 24 of the photodiode 20, it is possible to suppress changes in the potential of the back channel region of the semiconductor layer 12. Accordingly, this reduces variation in the properties of the TFT 10. Furthermore, when the electrode 50 is electrically connected to the gate electrode 18, the TFT 10 has a structure in which two gate electrodes are respectively arranged on both sides of one semiconductor layer (a so-called dual gate or double gate structure). The TFT 10, which has the dual gate structure, can cause the voltage applied between the source/drain to disperse, thereby effectively suppressing an increase in OFF current. Due to the TFT 10 having the dual gate structure, the light detection device 100 can have excellent reliability.

In the TFT 10 of the light detection device 100, which has the dual gate structure, the electrode 50 is electrically connected to the gate electrode 18, but the light detection device according to embodiments of the present invention is not limited to this. In the light detection device according to an embodiment of the present invention, when the TFT 10 has a dual gate structure, the electrode 50 does not need to be electrically connected to the gate electrode 18. Alternatively, signal voltages may be individually applied to the electrode 50 and the gate electrode 18. The signal voltages applied to the electrode 50 and the gate electrode 18 may be the same or different.

In the light detection device 100, each photodiode 20 is connected to one of the TFTs 10, but the light detection device according to embodiments of the present invention is not limited to this. Each of the photodiodes 20 of the light detection device according to an embodiment of the present invention may be connected to a plurality (2, 3, or more) of TFTs. The light detection device 100 according to an embodiment of the present invention may further include an amplifier (a source follower [common drain], for example). TFTs in which an oxide semiconductor is used for the material of the semiconductor layer have high mobility, and thus can be used as amplifier TFTs. An imaging device that has three TFTs for every pixel is described in Japanese Patent Application Laid-Open Publication No. 2006-165530, for example.

The light detection device 100 according to an embodiment of the present invention may further include a storage capacitor (CS) (not shown). Each of the photodiodes 20 in the light detection device according to an embodiment of the present invention may be connected to one TFT and one storage capacitor, for example. An electro-optical device having one TFT, photodiode, and storage capacitor for each pixel is described in Japanese Patent Application Laid-Open Publication No. 2009-238813 (Japanese Patent No. 5191259), for example.

The photodiode 20 of the light detection device according to an embodiment of the present invention is not limited to PIN, and may be PN instead.

Figure 2:
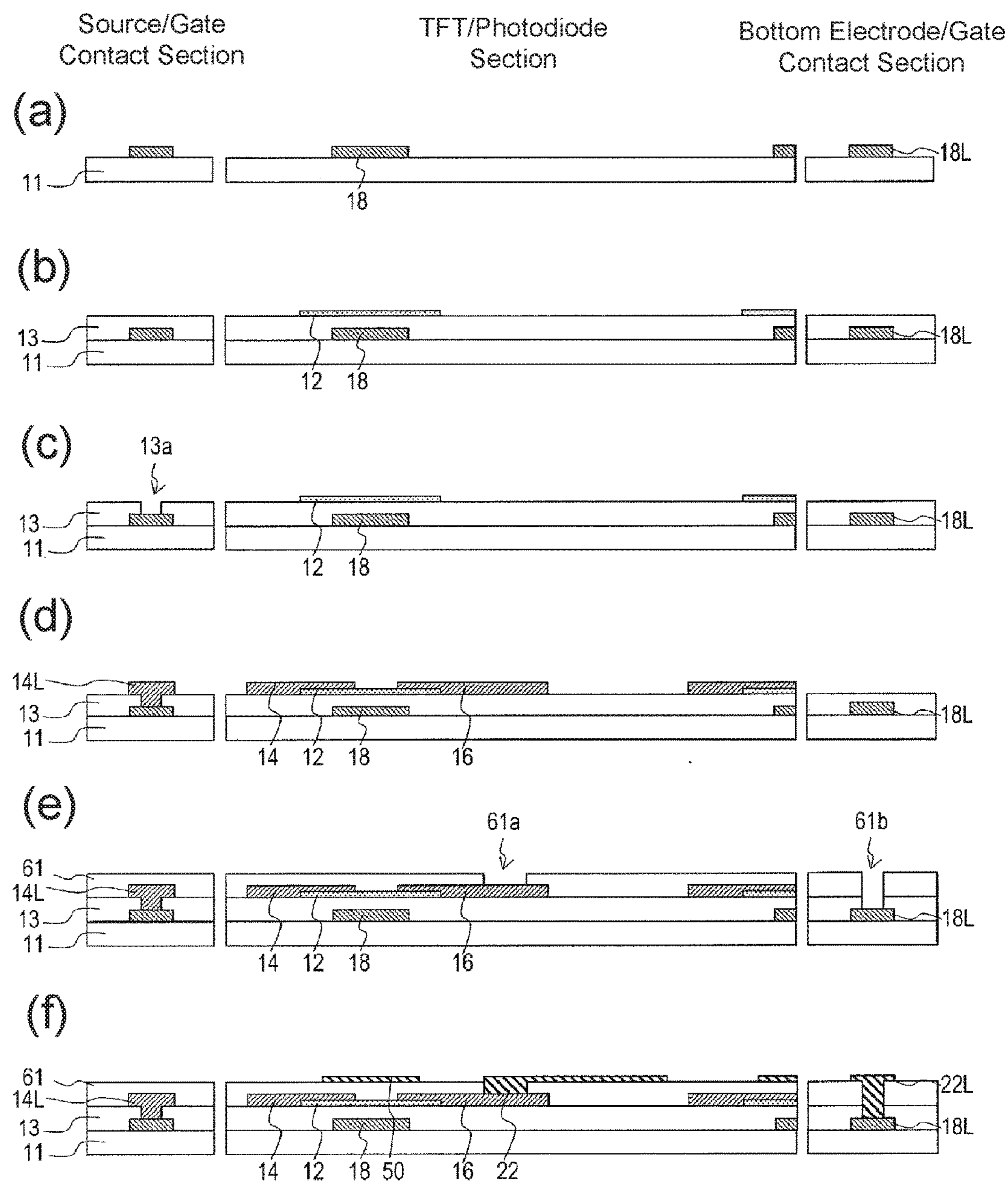
FIGS. 2(*a*) to (*f*) are schematic cross-sectional views for explaining one example of a method of manufacturing the light detection device 100 in one embodiment of the present invention.
Figure 3:
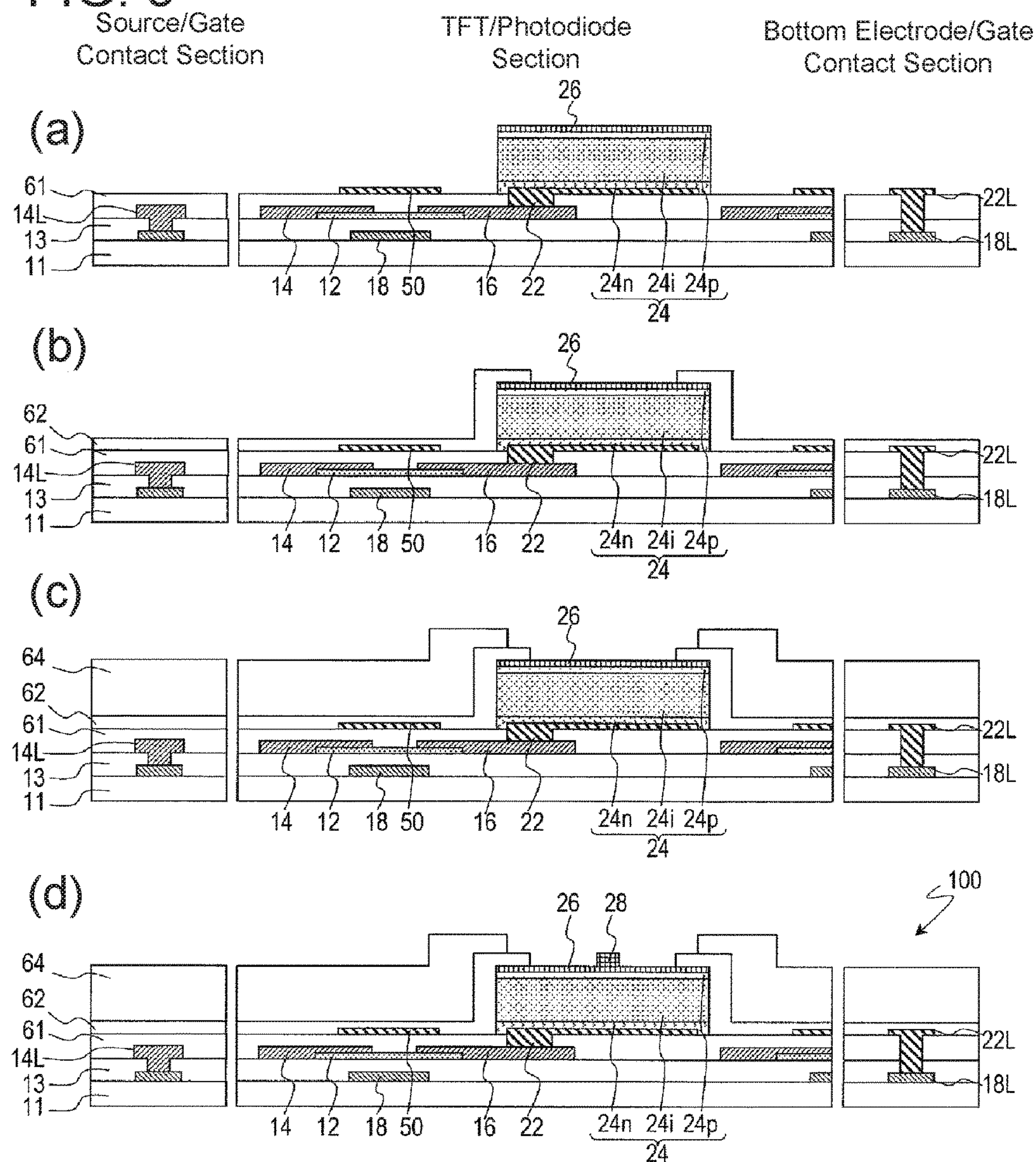
FIGS. 3(*a*) to (*d*) are schematic cross-sectional views for explaining one example of a method of manufacturing the light detection device 100 in one embodiment of the present invention.

Next, a method of manufacturing the light detection device 100 will be described with reference to FIGS. 2 and 3. FIGS. 2(*a*) to 2(*f*) and 3(*a*) to 3(*d*) are cross-sectional views schematically showing manufacturing steps of the light detection device 100. FIGS. 2 and 3 are, respectively, cross sections of the TFT/photodiode section, the source/gate contact section, and the bottom electrode/gate contact section of the light inspection device 100.

In this example, the "source/gate contact section" shows a location where a gate metal layer (first conductive layer) and source metal layer (second conductive layer) electrically connect to each other. The "bottom electrode/gate contact section" shows a location where the gate metal layer (first conductive layer) and a third conductive layer electrically connect to each other.

In the present specification, "gate metal layer (first conductive layer)" indicates a layer including an electrode, wiring line, terminal, or the like formed by patterning a conductive film that forms a gate electrode and a gate bus line, and may include, in addition to a gate electrode and a gate bus line, a CS bus line, a CS electrode, or the like, for example. Furthermore, "source metal layer (second conductive layer)" is a layer including an electrode, wiring line, terminal, or the like formed by patterning a conductive film that forms a source electrode, drain electrode, and source bus line, and may include, in addition to a source electrode, drain electrode, and source bus line, a drain drawn-out wiring line/electrode (a wiring line/electrode facing a CS bus line or CS electrode so as to form a storage capacitance) or the like, for example. A "third conductive layer" is a layer including an electrode, wiring line, terminal, or the like formed by patterning a conductive film that forms an electrode overlapping the bottom electrode and the semiconductor layer of the photodiode.

The source/gate contact section is formed in order to connect jumper wiring lines (wiring lines that straddle other wiring lines), for example. For example, when two wiring lines in the source metal layer intersect each other, one of the wiring lines connecting to the wiring line (jumper wiring line) in the gate metal layer at the two front and rear locations of the intersections makes it possible to intersect the two wiring lines without causing a short. A structure in which the source metal layer and the gate metal layer are connected to each other can also be formed at the gate terminal and/or source terminal. The laminate structure of the gate terminal and source terminal do not need to be the same as each other, and each individual laminate structure can either be the same as or different from the laminate structure of the source/gate contact section.

First, as shown in FIG. 2(*a*), the gate electrode 18 is formed on the substrate 11.

The substrate 11 is a glass substrate or a silicon substrate, for example. The substrate 11 may be formed of a heat-resistant plastic or resin. The substrate may be formed using polyethylene terephthalate (PET), polyethylene naphthalate (PEN), polyether sulfone (PES), an acrylic resin, or a polyimide, for example.

After depositing a first conductive film (gate metal film) 18L on the substrate 11, the first conductive film 18L is patterned to form the first conductive layer (gate metal layer) 18L, thereby forming the gate electrode 18. For simplicity, the first conductive film 18L and the first conductive layer 18L that is formed by patterning the first conductive film 18L are shown with the same reference character. The gate electrode 18 is formed of a metal such as aluminum (Al), tungsten (W), molybdenum (Mo), tantalum (Ta), chromium (Cr), titanium (Ti), or copper (Cu), for example. The gate electrode 18 may be an alloy including the above-mentioned metals. The gate electrode 18 may be a nitride including the above-mentioned metals. The thickness of the gate electrode is 100 nm to 500 nm, for example. The gate electrode 18 may be a single layer, or may have a structure in which a plurality of films are stacked on one another. In this example, W and TaN are deposited at a thickness of 370 nm and 50 nm, respectively, so as to form a gate electrode 18 having a laminate structure of W and TaN (W/TaN=370 nm/50 nm). After using a sputtering device to deposit a film on the substrate via evaporation of W and TaN, a prescribed shape (pattern) is formed through a photolithography process that uses dry etching, thereby forming the gate electrode 18.

Next, as shown in FIG. 2(*b*), the gate insulating film 13 and semiconductor layer 12 are formed on the first conductive layer (gate metal layer) 18L.

The gate insulating film 13 includes silicon dioxide ($SiO_2$), silicon nitride ($SiN_x$), silicon oxynitride ($SiO_xN_y$) (x>y), or silicon oxynitride ($SiN_xO_y$) (x>y), for example. The gate insulating film 13 may be a single layer or may be a laminate structure of a plurality of films. For example, when the gate insulating film 13 has a laminate structure of two layers, in order to prevent diffusion of impurities or the like from the substrate 11, it is preferable that the bottom layer of the gate insulating film 13 (the layer facing the substrate 11) be formed using silicon nitride ($SiN_x$), silicon oxynitride ($SiN_xO_y$) (x>y), or the like, and that the top layer of the gate insulating film 13 (the layer facing the semiconductor layer 12) be formed using silicon dioxide ($SiO_2$) or silicon oxynitride ($SiO_xN_y$) (x>y). Mixing a noble gas (such as argon) with the reactive gas used to form the gate insulating film 13 makes it possible to deposit a precise insulating film at a relatively low temperature. A precise insulating film can reduce the gate leakage current.

In this example, a CVD (chemical vapor deposition) device is used to deposit a 325 nm-thick SiN film as a bottom layer and a 10 nm-thick $SiO_2$ film on the bottom film as a top layer to form a gate insulating film 13 having a laminate structure.

Next, the semiconductor layer 12 is formed on the gate insulating film 13.

The semiconductor layer 12 includes an In—Ga—Zn—O based semiconductor (hereinafter, abbreviated as "In—Ga—Zn—O semiconductor"), for example. Here, an In—Ga—Zn—O semiconductor is a ternary oxide including In (indium), Ga (gallium), and Zn (zinc), and there is no special limitation to the ratio (composition ratio) of In, Ga, and Zn, and In:Ga:Zn=2:2:1, In:Ga:Zn=1:1:1, and In:Ga:Zn=1:1:2 and the like are included, for example. The semiconductor layer 12 may include $InGaO_3\ (ZnO)_5$, for example.

A TFT having an In—Ga—Zn—O semiconductor has high mobility (more than 20 times that of an amorphous silicon [a-Si] TFT) and low leakage current (a hundredth of that of an a-Si TFT), and therefore can be suitably used as a driver TFT and a pixel TFT. TFTs that have In—Ga—Zn—O semiconductor layers have high mobility, which can thus facilitate miniaturization of the TFTs. For example, using a TFT that has an In—Ga—Zn—O semiconductor layer makes it possible to greatly reduce power consumption of the light inspection device and/or improve resolution of the light detection device.

The In—Ga—Zn—O semiconductor may be amorphous (non-crystalline) or may include crystalline sections. It is preferable that a crystalline In—Ga—Zn—O semiconductor have a c-axis with an orientation that is mostly vertical to the layer surface. Such a crystalline structure of an In—Ga—Zn—O semiconductor is described in Japanese Patent Application Laid-Open Publication No. 2012-134475, for example. All the content disclosed in Japanese Patent Application Laid-Open Publication No. 2012-134475 is incorporated by reference in the present specification.

The semiconductor layer 12 may include other oxide semiconductors instead of an In—Ga—Zn—O semiconductor. The semiconductor layer may include Zn—O semiconductors (ZnO), In—Zn—O semiconductors (IZO [registered trademark]), Zn—Ti—O semiconductors (ZTO), Cd—Ge—O semiconductors, Cd—Pb—O semiconductors, cadmium oxide (CdO), Mg—Zn—O semiconductors, In—Sn—Zn—O semiconductors ($In_2O_3$—$SnO_2$—ZnO, for example), In—Ga—Sn—O semiconductors, or the like, for example.

Zn—O semiconductors includes semiconductors with no impurity elements added to ZnO and those with impurities added to ZnO. Zn—O semiconductors include semiconductors having added thereto one or several impurity elements from among group 1 elements, group 13 elements, group 14 elements, group 15 elements, group 17 elements, or the like, for example. Zn—O semiconductors include magnesium zinc oxide ($Mg_xZn_{1-x}O$) or cadmium zinc oxide ($Cd_xZn_{1-x}O$), for example. Zn—O semiconductors may be amorphous (non-crystalline), or may be polycrystalline, or may a microcrystalline state that combines non-crystalline states and polycrystalline states.

The semiconductor layer 12 may include other semiconductors instead of an oxide semiconductor. The semiconductor layer may include amorphous silicon, polysilicon, low temperature polysilicon, or the like, for example.

The thickness of the semiconductor layer 12 is 30 nm to 100 nm, for example. In this example, after the semiconductor is deposited through sputtering, a prescribed shape (pattern) is processed via a photolithography process including etching with a resist mask, thereby forming the semiconductor layer 12.

Next, as shown in FIG. 2(*c*), a first contact hole 13*a* for forming the source/gate contact section is formed on the gate insulating film 13.

The first contact hole 13*a* is formed through a photolithography process that includes a step of forming a resist mask having an opening for forming the first contact hole 13*a* in the gate insulating film 13 and a step of etching the gate insulating film 13.

Next, as shown in FIG. 2(*d*), the source electrode 14 and drain electrode 16 are formed.

The source electrode 14 and the drain electrode 16 are formed by depositing the second conductive film (source metal film) 14L on the semiconductor layer 12 and then patterning the second conductive film 14L to form the second conductive layer (source metal layer) 14L, for example. For simplicity, the second conductive film 14L and the second conductive layer 14L that is formed by patterning the second conductive film 14L are shown with the same reference character. The source electrode 14 and drain electrode 16 are typically formed from the same film, but are not limited to this, and may be formed from different films. The source electrode 14 and the drain electrode 16 are each made of a metal such as aluminum (Al), tungsten (W), molybdenum (Mo), tantalum (Ta), chromium (Cr), titanium (Ti), or copper (Cu), for example. The source electrode 14 and the drain electrode 16 may each be an alloy including the above-mentioned metals. The source electrode 14 and the drain electrode 16 may each include a nitride of the above metals. The source electrode 14 and the drain electrode 16 may each be a single layer or may have a laminate structure of a plurality of films. The thickness of the source electrode 14 and drain electrode 16 is 100 nm to 500 nm each, for example.

In this example, the source electrode 14 and the drain electrode 16 are formed having a laminate structure of Ti and Al (Ti/Al/Ti=100 nm/300 nm/30 nm). A sputtering device is used to form Ti and Al films in this order, and then a photolithography process using dry etching processes a prescribed shape (pattern), thereby forming the source electrode 14 and the drain electrode 16.

Next, as shown in FIG. 2(*e*), a first passivation film 61 is formed.

The first passivation film 61 is made of an insulating material. The first passivation film 61 includes silicon nitride, silicon dioxide, silicon oxynitride, or silicon oxynitride. The first passivation film 61 may be a single layer or may have a structure (2, 3, or more layers) in which a plurality of films have been stacked. The first passivation film 61 is formed by a plasma CVD method or a sputtering method, for example. The thickness of the first passivation film 61 is 200 nm to 500 nm, for example. It is preferable that the thickness of the first passivation film 61 is greater than the thickness cut from the first passivation film 61 during the step of forming the photodiode 20 (during the etching step for forming the semiconductor laminate structure 24 and top electrode 26 as described later, for example). Furthermore, if necessary, a step may be performed in which the entire surface of the substrate 11 is heated (to 350°, for example).

Next, two second contact holes 61*a* and 61*b* are formed on the first passivation film 61. The second contact hole 61 is for electrically connecting the drain electrode 16 to the bottom electrode 22, and the second contact hole 61*b* is for forming the bottom electrode/gate contact section. The second contact holes 61*a* and 61*b* are formed with the same method as the first contact hole 13*a*, for example.

Next, as shown in FIG. 2(*f*), the bottom electrode 22 and the electrode 50 are formed.

A third conductive film 22L is deposited and then patterned to form a third conductive layer 22L, thereby forming the bottom electrode 22 and electrode 50. For simplicity, the third conductive film 22L, and the third conductive layer 22L that is formed by patterning the third conductive film 22L are shown with the same reference character. The bottom electrode 22 and electrode 50 are formed of a metal such as aluminum (Al), tungsten (W), molybdenum (Mo), tantalum (Ta), chromium (Cr), titanium (Ti), or copper (Cu), for example. The bottom electrode 22 and the electrode 50 may each be an alloy including the above-mentioned metals. The bottom electrode 22 and the electrode 50 may each be a nitride including the above-mentioned metals. The thickness of the bottom electrode 22 and electrode 50 is 100 nm to 300 nm each, for example. The bottom electrode 22 and electrode 50 may be a single layer, or may have a structure in which a plurality of films are stacked on one another.

In this example, after Mo is deposited at a thickness of 200 nm by sputtering, a prescribed shape (pattern) is formed via a photolithography process using dry etching, thereby forming the bottom electrode 22 and electrode 50.

Next, as shown in FIG. 3(*a*), the semiconductor laminate structure 24 and the top electrode 26 are formed.

If the photodiode 20 is a PIN type diode, for example, then the semiconductor laminate structure 24 has an i-type semiconductor layer 24*i* provided between an n-type semiconductor layer 24*n* and a p-type semiconductor layer 24*p*. The n-type semiconductor layer 24*n* is made of a semiconductor (n-type semiconductor) where electrons, which hold negative charge, are the carriers, and the n-type semiconductor layer 24*n* includes a region ($n^+$ region) in the semiconductor laminate structure 24 where the concentration of n-type carriers (electrons) is large. The n-type semiconductor layer 24*n* is made of non-crystalline silicon (amorphous silicon: a-Si), for example. The thickness of the n-type semiconductor layer 24*n* is 40 nm to 50 nm, for example. The p-type semiconductor layer 24*p* is made of a semiconductor (p-type semiconductor) where holes, which hold positive charge, are the carriers, and the p-type semiconductor layer 24*p* includes a region ($p^+$ region) in the semiconductor laminate structure 24 where the concentration of p-type carriers (holes) is large. The p-type semiconductor layer 24*p* is made of non-crystalline silicon, for example. The thickness of the n-type semiconductor layer 24*p* is 10 nm to 50 nm, for example. The i-type semiconductor layer 24*i* is made of a semiconductor layer that has a lower conductivity than the n-type semiconductor layer 24*n* and the p-type semiconductor layer 24*p*, and is made of an intrinsic semiconductor, for example. The i-type semiconductor layer 24*i* is made of non-crystalline silicon, for example. The thickness of the i-type semiconductor layer 24*i* is 400 nm to 1000 nm, for example. The photodiode 20, by having the thick i-type semiconductor layer 24*i*, has a thick depletion layer, which makes it possible to have high photoelectric conversion efficiency. Furthermore, the p-type semiconductor layer 24*p* may be formed by injecting acceptors (B, if the i-type semiconductor layer 24*i* is made of Si, for example) into a region on the end of the i-type semiconductor layer 24*i* (the top part, for example) via ion shower doping or ion implantation, for example.

The top electrode 26 is made of a transparent conductive material (e.g., IZO or ITO [indium tin oxide]), for example.

In this example, the material of the n-type semiconductor layer 24*n*, i-type semiconductor layer 24*i*, and p-type semiconductor layer 24*p* is deposited on the third conductive layer 22L in this order on the entire surface of the substrate 11 using CVD, and then the transparent conductive material is deposited via sputtering on the regions having the regions where the semiconductor laminate structure 24 will be formed. Thereafter, a photolithography process is used to form a prescribed shape (pattern), thereby forming the semiconductor laminate structure 24 and the top electrode 26.

Next, as shown in FIG. 3(*b*), a second passivation film 62 is formed.

The second passivation film 62 covers the entire surface of the TFT 10 and all side faces and a portion (end portion) of the top of the photodiode 20, for example. The second passivation film 62 is made of the same material as the first passivation film 61, for example. The second passivation film 62 is formed by using CVD to deposit an insulating material so as to cover the entire surface of the TFT 10 and the side faces and top of the photodiode 20, and then using a photolithography process to open a portion of the top of the photodiode 20, for example.

Next, as shown in FIG. 3(*c*), a planarizing film 64 is formed.

The planarizing film 64 is formed on the second passivation film 62. The planarizing film 64 is made of an inorganic insulating material (such as silicon dioxide, silicon nitride, silicon oxynitride, silicon nitride oxide, and TEOS [tetraethyl orthosilicate]), or an organic insulating material, for example. The planarizing film 64 is formed by deposition via CVD and then using a photolithography process with etching (e.g., dry etching) to form a prescribed shape (pattern), for example. If a photosensitive resin is used as the material of the planarizing film 64, then patterning is possible without using a photoresist.

Next, as shown in FIG. 3(*d*), a bias line 28 is formed.

The bias line 28 is formed on the top electrode 26. The bias line 28 is made of Mo, Ti, or the like, for example. The bias line 28 is formed by deposition via sputtering and then using a photolithography process to form a prescribed shape, for example.

The steps described above manufacture the light detection device 100.

Figure 4:
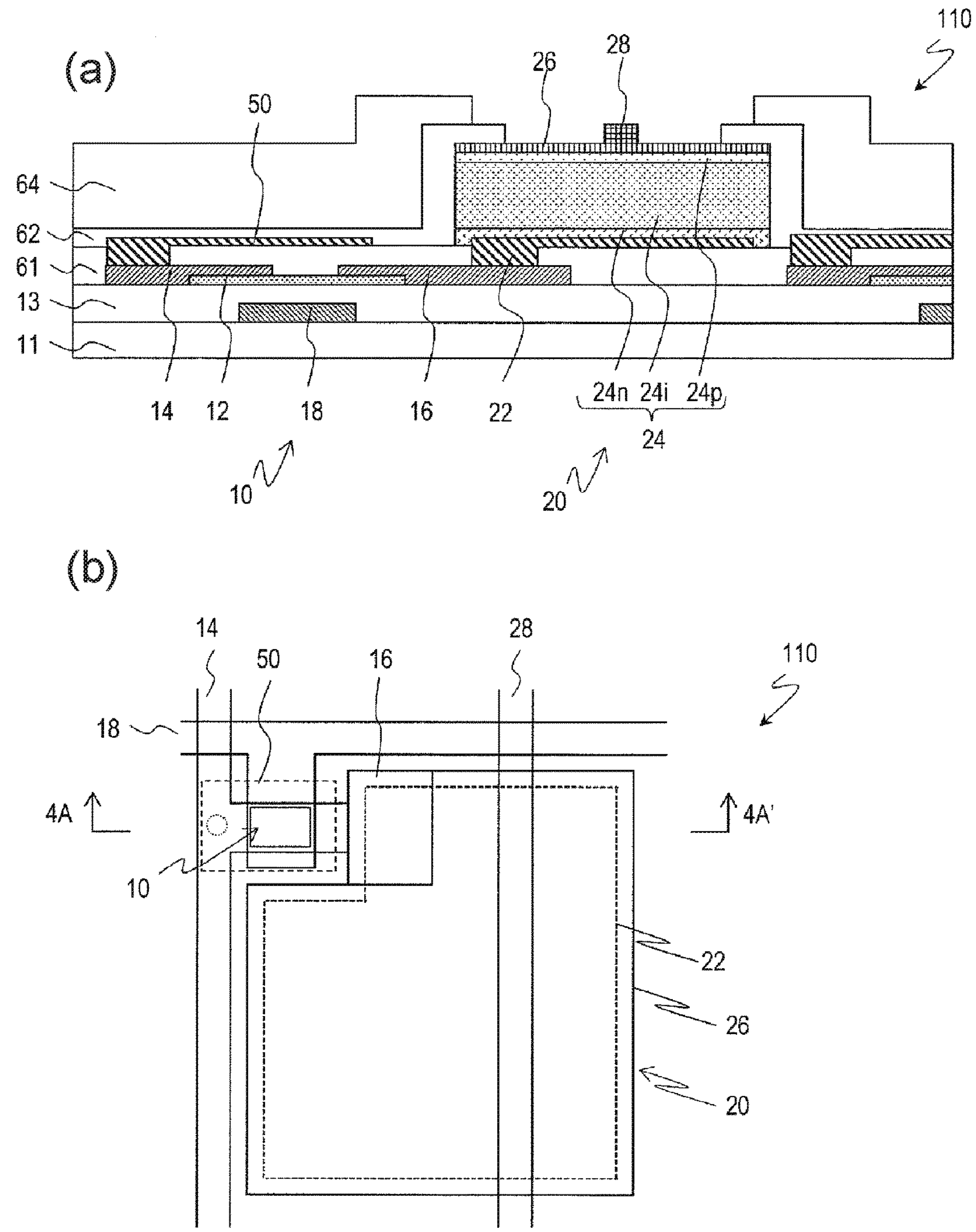
FIG. 4(*a*) is a light detection device 110 of another embodiment of the present invention in a schematic cross-section along line 4A-4A' in FIG. 4(*b*), which itself is a schematic plan view of the light detection device 110.

FIG. 4 shows a schematic cross-sectional and plan view of a light detection device 110 according to another embodiment of the present invention. FIG. 4(*a*) is a schematic cross-sectional view of the light detection device 110 along the line 4A-4A' in FIG. 4(*b*), and FIG. 4(*b*) is a schematic plan view of the light detection device 110.

As shown in FIG. 4(*a*) and FIG. 4(*b*), the light detection device 100 differs from the light detection device 100 in that the electrode 50 is electrically connected to the source electrode 14. The light detection device 110 may otherwise be the same as the light detection device 100 aside from the electrical connection of the electrode 50.

The light detection device 110 includes the electrode 50 formed of the same conductive film as the bottom electrode 22, and when viewed from a direction normal to the substrate 11, the electrode 50 overlaps the semiconductor layer 12 with the insulating layer (first passivation film 61) interposed therebetween; therefore, during the process (etching process, for example) of forming the semiconductor laminate structure 24, the electrode 50 can function as an etch-stop for the first passivation film 61. Furthermore, during the process of forming the semiconductor laminate structure 24 (dry etching process, for example), the electrode 50 can suppress charge from accumulating on the first passivation film 61. The light detection device 110 has the electrode 50 electrically connected to the source electrode 14; therefore, during the process of forming the semiconductor laminate structure 24 (dry etching process, for example), changes in the potential of the back channel region of the semiconductor layer 12 can be suppressed. Due to the above reasons, damage to the semiconductor layer 12 can be reduced during the process of forming the semiconductor laminate structure 24. The light detection device 110 suppresses changes in the properties of the TFT 10 and reduces variation in the properties of the TFT 10, thus exhibiting excellent reliability.

The electrode 50 is made from the same conductive film as the bottom electrode 22, and thus the light detection device 110 does not require additional manufacturing steps and has excellent reliability.

The method of manufacturing the light detection device 110 may be the same method of manufacturing the light detection device 100, except for the electrical connection of the electrode 50. In the manufacturing process of the light detection device 110, it is possible to omit the process of fabricating the bottom electrode/gate contact section.

Figure 5:
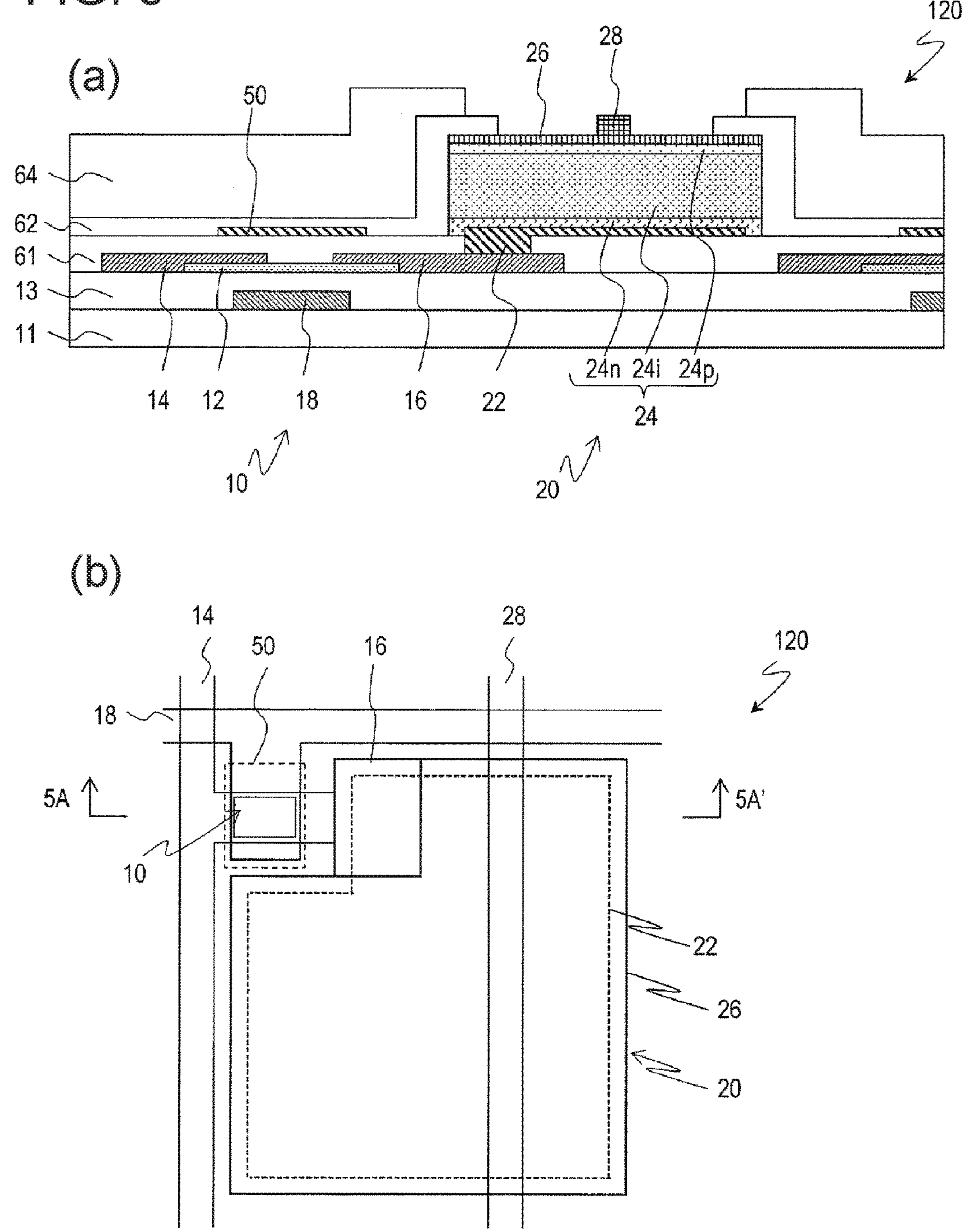
FIG. 5(*a*) is a light detection device 120 of another embodiment of the present invention in a schematic cross-section along line 5A-5A' in FIG. 5(*b*), which itself is a schematic plan view of the light detection device 120.

Next, FIG. 5 shows a schematic cross-sectional and plan view of a light detection device 120 according to yet another embodiment of the present invention. FIG. 5(*a*) is a schematic cross-sectional view of the light detection device 120 along the line 5A-5A' in FIG. 5(*b*), and FIG. 5(*b*) is a schematic plan view of the light detection device 120.

As shown in FIG. 5(*a*) and FIG. 5(*b*), the light detection device 120 differs from the light detection device 100 in that the electrode 50 is electrically floating. The electrode 50 of the light detection device 120 is not electrically connected to any other electrodes or wiring lines. The light detection device 120 may otherwise be the same as the light detection device 100 aside from the electrical connection of the electrode 50.

The light detection device 120 includes the electrode 50 formed of the same conductive film as the bottom electrode 22, and when viewed from a direction normal to the substrate 11, the electrode 50 overlaps the semiconductor layer 12 with the insulating layer (first passivation film 61) interposed therebetween; therefore, during the process (etching process, for example) of forming the semiconductor laminate structure 24, the electrode 50 can function as an etch-stop for the first passivation film 61. Furthermore, during the process of forming the semiconductor laminate structure 24 (dry etching process, for example), the electrode 50 can suppress charge from accumulating on the first passivation film 61. Due to the above reasons, damage to the semiconductor layer 12 can be reduced during the process of forming the semiconductor laminate structure 24. The light detection device 120 suppresses changes in the properties of the TFT 10 and reduces variation in the properties of the TFT 10, thus exhibiting excellent reliability.

The electrode 50 is made from the same conductive film as the bottom electrode 22, and thus the light detection device 120 does not require additional manufacturing steps and has excellent reliability.

The method of manufacturing the light detection device 120 may be the same method of manufacturing the light detection device 100, except for the electrical connection of the electrode 50. In the manufacturing process of the light detection device 120, it is possible to omit the process of fabricating the bottom electrode/gate contact section.

Figure 6:
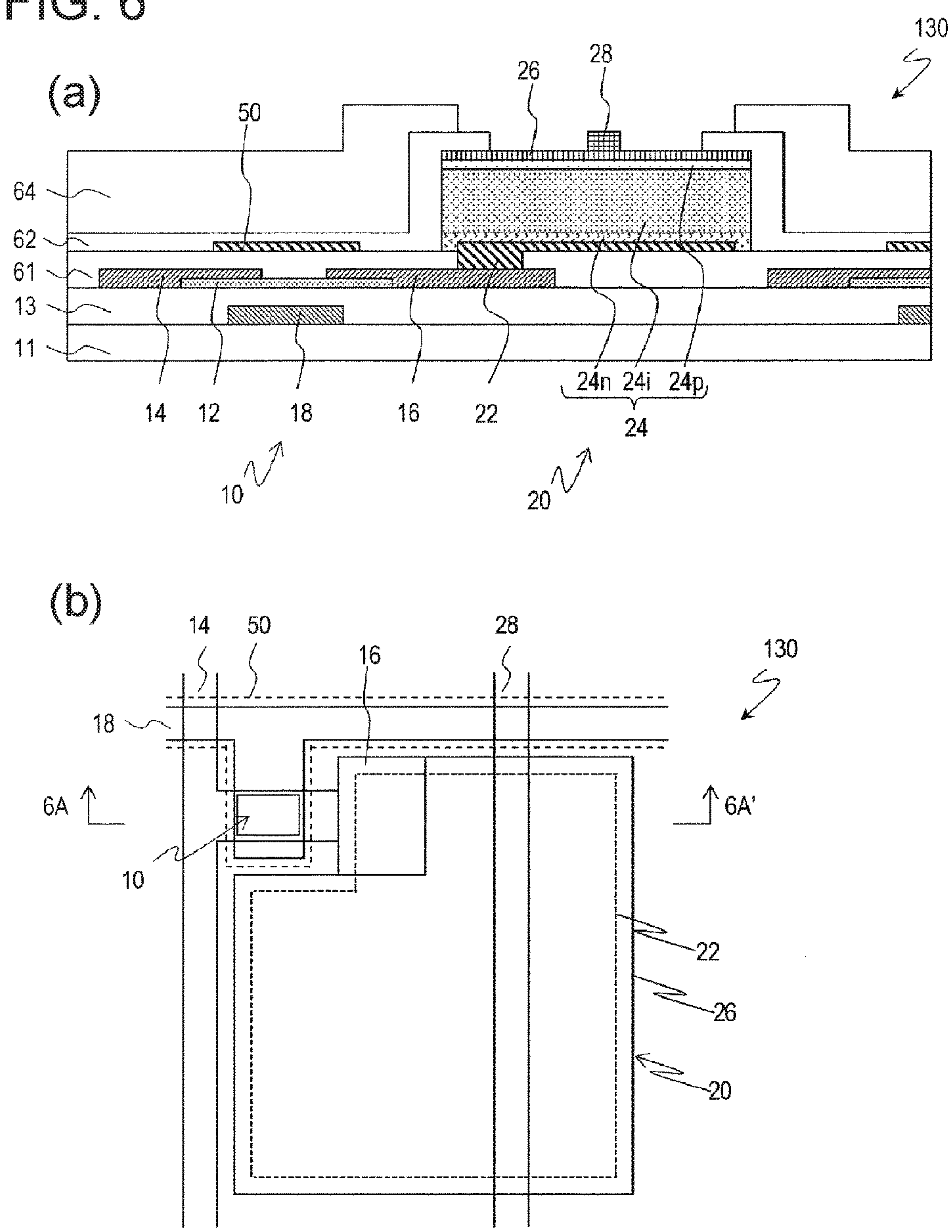
FIG. 6(*a*) is a light detection device 130 of yet another embodiment of the present invention in a schematic cross-section along line 6A-6A' in FIG. 6(*b*), which itself is a schematic plan view of the light detection device 130.

Next, FIG. 6 shows a schematic cross-sectional and plan view of a light detection device 130 according to yet another embodiment of the present invention. FIG. 6(*a*) is a schematic cross-sectional view of the light detection device 130 along the line 6A-6A' in FIG. 6(*b*), and FIG. 6(*b*) is a schematic plan view of the light detection device 130.

As shown in FIG. 6(*a*) and FIG. 6(*b*), the light detection device 130 differs from the light detection device 100 in that the electrode 50 is electrically connected to a wiring line that is electrically isolated from both the source electrode 14 and the gate electrode 18. The light detection device 130 may otherwise be the same as the light detection device 100 aside from the electrical connection of the electrode 50.

The light detection device 130 includes the electrode 50 formed of the same conductive film as the bottom electrode 22, and when viewed from a direction normal to the substrate 11, the electrode 50 overlaps the semiconductor layer 12 with the insulating layer (first passivation film 61) interposed therebetween; therefore, during the process (etching process, for example) of forming the semiconductor laminate structure 24, the electrode 50 can function as an etch-stop for the first passivation film 61. Furthermore, during the process of forming the semiconductor laminate structure 24 (dry etching process, for example), the electrode 50 can suppress charge from accumulating on the first passivation film 61. The light detection device 130 has the electrode 50 electrically connected to a wiring line that is electrically isolated from both the source electrode 14 and the gate electrode 18; therefore, during the process of forming the semiconductor laminate structure 24 (dry etching process, for example), changes in the potential of the back channel region of the semiconductor layer 12 can be suppressed. Due to the above reasons, damage to the semiconductor layer 12 can be reduced during the process of forming the semiconductor laminate structure 24. The light detection device 130 suppresses changes in the properties of the TFT 10 and reduces variation in the properties of the TFT 10, thus exhibiting excellent reliability.

The electrode 50 is made from the same conductive film as the bottom electrode 22, and thus the light detection device 130 does not require additional manufacturing steps and has excellent reliability.

The light detection device 130 can control (adjust) the threshold voltage of the TFT 10 by applying a voltage signal that differs from the gate voltage to the electrode 50. The light detection device 130 can effectively reduce variation in the properties of the TFT 10.

The method of manufacturing the light detection device 130 may be the same method of manufacturing the light detection device 100, except for the electrical connection of the electrode 50. In the manufacturing process of the light detection device 130, it is possible to omit the process of fabricating the bottom electrode/gate contact section.

Figure 7:
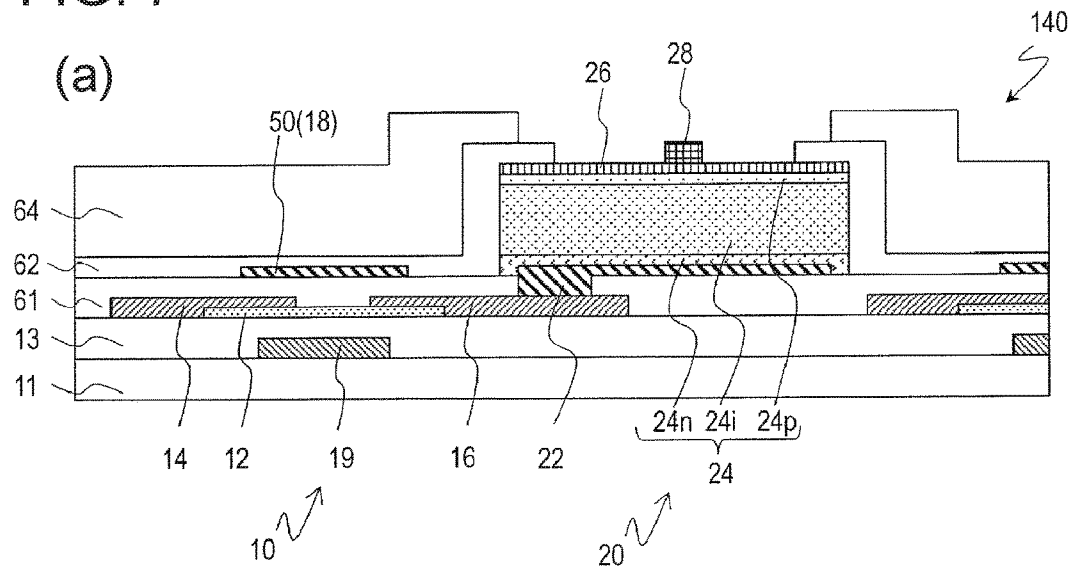
FIG. 7(*a*) is a light detection device 140 of yet another embodiment of the present invention in a schematic cross-section along line 7A-7A' in FIG. 7(*b*), which itself is a schematic plan view of the light detection device 140.
Figure 7:
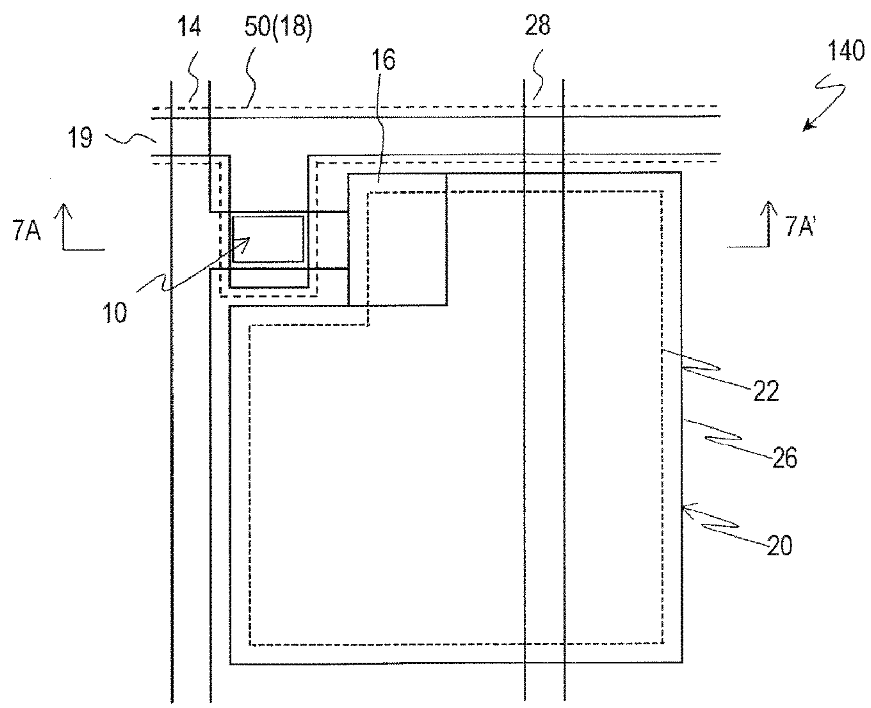

Next, FIG. 7 shows a schematic cross-sectional and plan view of a light detection device 140 according to yet another embodiment of the present invention. FIG. 7(*a*) is a schematic cross-sectional view of the light detection device 140 along the line 7A-7A' in FIG. 7(*b*), and FIG. 7(*b*) is a schematic plan view of the light detection device 140.

As shown in FIG. 7(*a*) and FIG. 7(*b*), the electrode 50 of the light detection device 140 functions as the gate electrode 18. The light detection device 140 has an additional electrode 19 between the substrate 11 and the semiconductor layer 12, and the additional electrode 19 is electrically connected to a wiring line that is electrically isolated from both the source electrode 14 and the gate electrode 50. The light detection device 140 may otherwise be the same as the light detection device 100 aside from the above-mentioned aspects.

The light detection device 140 includes the electrode 50 formed of the same conductive film as the bottom electrode 22, and when viewed from a direction normal to the substrate 11, the electrode 50 overlaps the semiconductor layer 12 with the insulating layer (first passivation film 61) interposed therebetween; therefore, during the process (etching process, for example) of forming the semiconductor laminate structure 24, the electrode 50 can function as an etch-stop for the first passivation film 61. Furthermore, during the process of forming the semiconductor laminate structure 24 (dry etching process, for example), the electrode 50 can suppress charge from accumulating on the first passivation film 61. The light detection device 140 has the electrode 50 functioning as the gate electrode 18; therefore, during the process of forming the semiconductor laminate structure 24 (dry etching process, for example), changes in the potential of the back channel region of the semiconductor layer 12 can be suppressed. Due to the above reasons, damage to the semiconductor layer 12 can be reduced during the process of forming the semiconductor laminate structure 24. The light detection device 140 suppresses changes in the properties of the TFT 10 and reduces variation in the properties of the TFT 10, thus exhibiting excellent reliability.

The electrode 50 is made from the same conductive film as the bottom electrode 22, and thus the light detection device 140 does not require additional manufacturing steps and has excellent reliability.

The TFT 10 of the light detection device 140 is a top-gate TFT in which the electrode 50 functions as the gate electrode 18. The additional electrode 19 of the light detection device 140 can function as a light-shielding film that prevents light from the substrate 11 direction (such as backlight [not shown]) from entering the semiconductor layer 12, thereby making it possible to suppress changes in the properties of the TFT 10. The light detection device 140 can have the light-shielding film and top-gate TFT without adding new steps to the manufacturing process of the light detection device 100.

The additional electrode 19 of the light detection device 140 is made of the same film as the gate electrode 18 of the light detection device 100, for example. The method of manufacturing the light detection device 140 may be the same method of manufacturing the light detection device 100, except for the electrical connection of the electrode 50 and additional electrode 19. In the manufacturing process of the light detection device 140, it is possible to omit the process of fabricating the bottom electrode/gate contact section.

Figure 8:
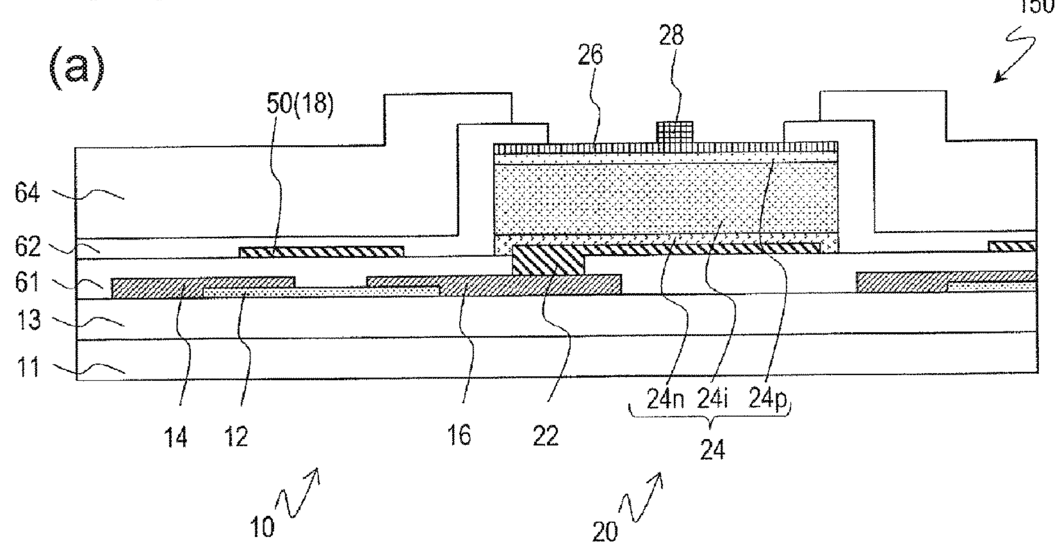
FIG. 8(*a*) is a light detection device 150 of yet another embodiment of the present invention in a schematic cross-section along line 8A-8A' in FIG. 8(*b*), which itself is a schematic plan view of the light detection device 150.
Figure 8:
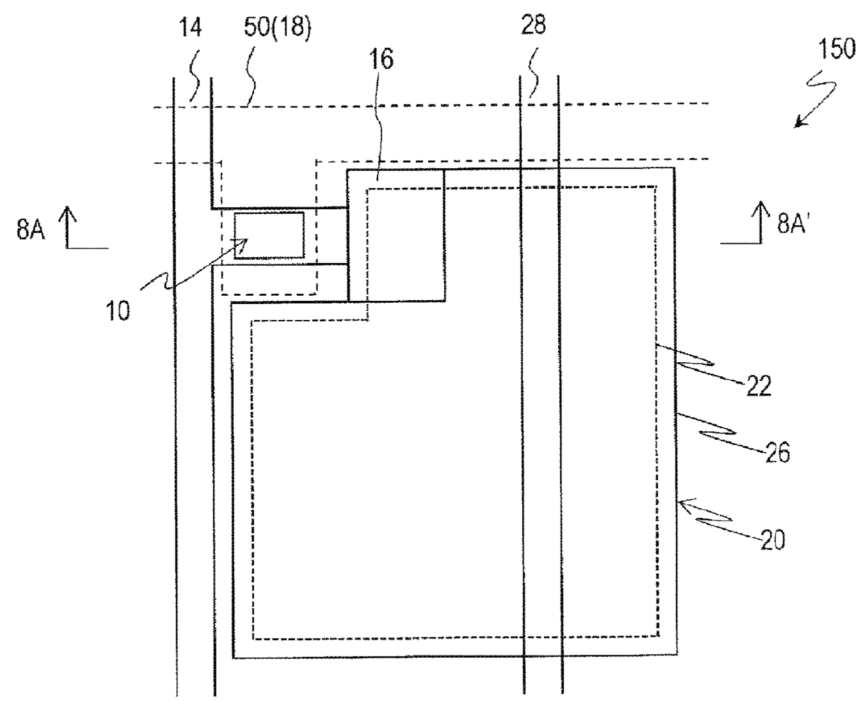

Next, FIG. 8 shows a schematic cross-sectional and plan view of a light detection device 150 according to yet another embodiment of the present invention. FIG. 8(*a*) is a schematic cross-sectional view of the light detection device 150 along the line 8A-8A' in FIG. 8(*b*), and FIG. 8(*b*) is a schematic plan view of the light detection device 150.

As shown in FIG. 8(*a*) and FIG. 8(*b*), the electrode 50 of the light detection device 150 functions as the gate electrode 18. The light detection device 150 does not have an additional electrode between the substrate 11 and the semiconductor layer 12. The light detection device 150 may be the same as the light detection device 140, except for not having the additional electrode between the substrate 11 and the semiconductor layer 12.

The light detection device 150 includes the electrode 50 formed of the same conductive film as the bottom electrode 22, and when viewed from a direction normal to the substrate 11, the electrode 50 overlaps the semiconductor layer 12 with the insulating layer (first passivation film 61) interposed therebetween; therefore, during the process (etching process, for example) of forming the semiconductor laminate structure 24, the electrode 50 can function as an etch-stop for the first passivation film 61. Furthermore, during the process of forming the semiconductor laminate structure 24 (dry etching process, for example), the electrode 50 can suppress charge from accumulating on the first passivation film 61. The light detection device 150 has the electrode 50 functioning as the gate electrode 18; therefore, during the process of forming the semiconductor laminate structure 24 (dry etching process, for example), changes in the potential of the back channel region of the semiconductor layer 12 can be suppressed. Due to the above reasons, damage to the semiconductor layer 12 can be reduced during the process of forming the semiconductor laminate structure 24. The light detection device 150 suppresses changes in the properties of the TFT 10 and reduces variation in the properties of the TFT 10, thus exhibiting excellent reliability.

The electrode 50 is made from the same conductive film as the bottom electrode 22, and thus the light detection device 150 does not require additional manufacturing steps and has excellent reliability.

The light detection device 150 does not have the additional electrode, and thus can be manufactured in fewer steps than the light detection device 140. The method of manufacturing the light detection device 150 may be the same method of manufacturing the light detection device 140, except for not having the additional electrode 19.

INDUSTRIAL APPLICABILITY

The light detection device according to the embodiments of the present invention is used for various types of light detection devices or radiation detection devices, such as flat-panel X-ray detection devices, image sensors, and the like. The detection device of the embodiments of the present invention is not limited to the medical field and can be used in the non-destructive testing of baggage or the like at airports, for example.

DESCRIPTION OF REFERENCE CHARACTERS

10 TFT
11 substrate
12 semiconductor layer
13 gate insulating film
14 source electrode (source bus line)
16 drain electrode
18 gate electrode (gate bus line)
20 photodiode
22 bottom electrode
24 semiconductor laminate structure
26 top electrode
28 bias electrode (bias line)
50 electrode
61 first passivation film
62 second passivation film
64 planarizing film
100, 110, 120, 130, 140, 150 light detection device

What is claimed is:

1. A light detection device, comprising:
a substrate;
a thin film transistor on the substrate, the thin film transistor including a semiconductor layer, a source electrode, a drain electrode, and a gate electrode;
an insulating layer that covers the semiconductor layer;
a photodiode formed on the insulating layer, the photodiode including a bottom electrode directly connected to the drain electrode of the thin film transistor through a contact hole formed in the insulating layer, a semiconductor laminate structure, and a top electrode that sandwiches the semiconductor laminate structure with the bottom electrode, the top electrode and the semiconductor laminate structure together extending beyond and covering all edges of the bottom electrode in a plan view; and
an electrode formed on the insulating layer, the electrode being made of a same conductive film as the bottom electrode of the photodiode and arranged so as to overlap the semiconductor layer with the insulating layer interposed therebetween, the electrode being either one of said gate electrode or a separate electrode different from the gate electrode,
wherein the semiconductor layer of the thin film transistor includes an oxide semiconductor.

2. The light detection device according to claim 1,
wherein the gate electrode is arranged between the substrate and the semiconductor layer of the thin film transistor, and
wherein the electrode includes a portion facing the gate electrode across the semiconductor layer of the thin film transistor.

3. The light detection device according to claim 1, wherein the electrode is the separate electrode different from the gate electrode and is electrically connected to the gate electrode.

4. The light detection device according to claim 1, wherein the electrode is the separate electrode different from the gate electrode and is electrically connected to the source electrode.

5. The light detection device according to claim 1, wherein the electrode is the separate electrode different from the gate electrode and is in an electrically floating state.

6. The light detection device according to claim 1, wherein the electrode is the separate electrode different from the gate electrode and is connected to a wiring line that is electrically isolated from both the source electrode and the gate electrode.

7. The light detection device according to claim 1, wherein the electrode is the gate electrode.

8. The light detection device according to claim 7, further comprising an additional electrode between the substrate and the semiconductor layer, said additional electrode being connected to a wiring line that is electrically isolated from both the source electrode and the gate electrode.

9. The light detection device according to claim 1, wherein the oxide semiconductor includes an In—Ga—Zn—O semiconductor.

10. The light detection device according to claim 9, wherein the In—Ga—Zn—O semiconductor includes crystalline sections.

11. The light detection device according to claim 1, further comprising: an insulating planarizing film formed between the insulating layer and a layer in which the bottom electrode of the photodiode and the electrode are formed.

12. The light detection device according to claim 1, wherein said electrode covers an entirety of a channel region of the semiconductor layer in the plan view.

13. The light detection device according to claim 1, wherein said electrode covers an entirety of the semiconductor layer in the plan view.

* * * * *